United States Patent [19]

Matthews

[11] 4,234,828
[45] Nov. 18, 1980

[54] SELF-OSCILLATING SAWTOOTH CURRENT DEFLECTION GENERATOR

[75] Inventor: Lloyd E. Matthews, Berwyn, Ill.

[73] Assignee: Zenith Radio Corporation, Glenview, Ill.

[21] Appl. No.: 77,434

[22] Filed: Sep. 20, 1979

[51] Int. Cl.³ .................. H01J 29/70; H01J 29/76
[52] U.S. Cl. ............................................ 315/408
[58] Field of Search ............. 315/403, 408, 409, 410, 315/399

[56] References Cited
U.S. PATENT DOCUMENTS

| | | |
|---|---|---|
| 3,435,282 | 5/1969 | Barchok . |
| 4,110,666 | 8/1978 | Farina .................................. 315/408 |
| 4,122,363 | 10/1978 | Zappala et al. ..................... 307/228 |

Primary Examiner—Theodore M. Blum
Attorney, Agent, or Firm—Thomas E. Hill

[57] ABSTRACT

Disclosed is an SCR-analogue, dual coupled transistor vertical oscillator for synching the vertical sweep in a video display with vertical synchronization input signals. Capable of stable, free-running oscillation at two, variable DC levels, the coupled transistor configuration in combination with a capacitor generates a precisely defined sawtooth voltage waveform for controlling vertical sweep and flyback. This combination provides an inexpensive, flexible means for synchronizing sweep drive circuitry operating at various DC coupled levels with a wide range of synchronization input signals.

5 Claims, 5 Drawing Figures

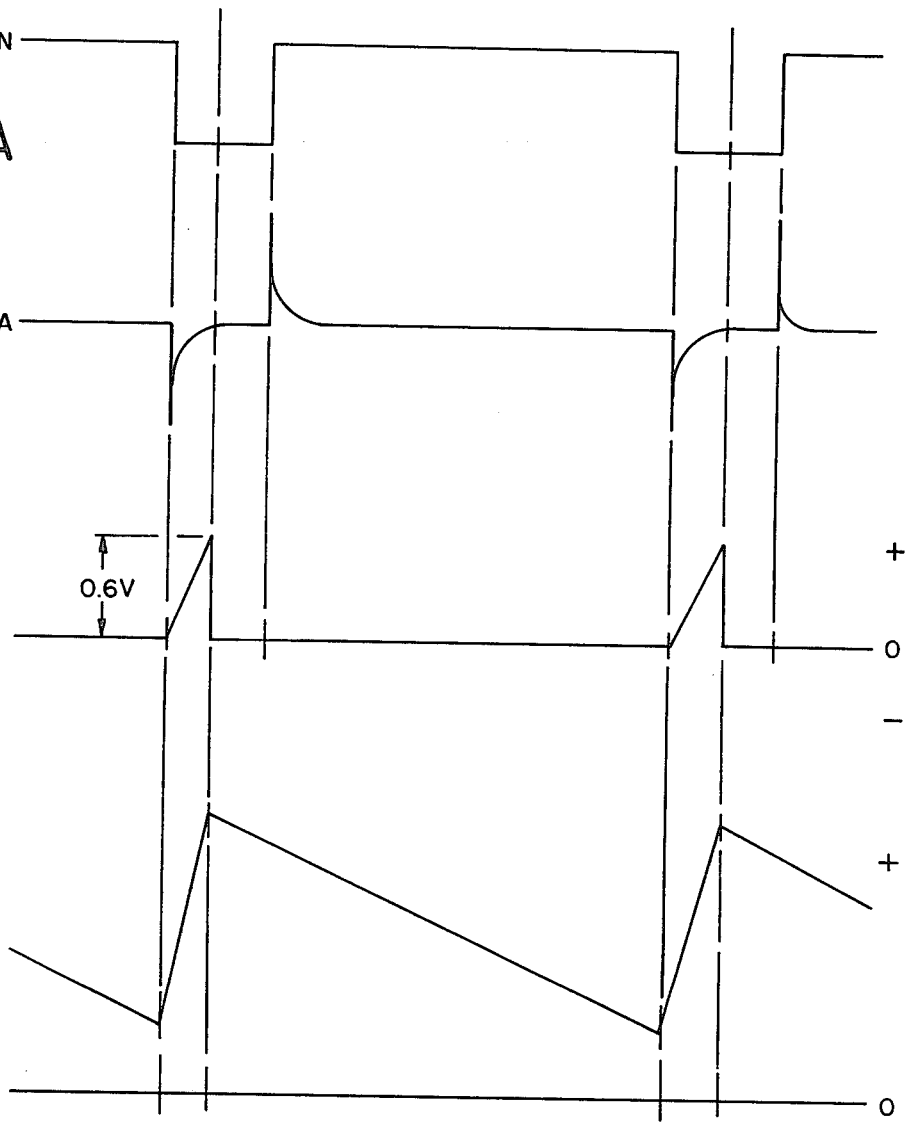

SELF-OSCILLATING SAWTOOTH CURRENT DEFLECTION GENERATOR

CROSS REFERENCE TO RELATED PATENT APPLICATION

This application is related to, but in no way dependent upon, the following application which is assigned to the assignee of the present application: Ser. No. 077,432, filed Sept. 20, 1979 entitled "VERTICAL DRIVE CIRCUIT FOR VIDEO DISPLAY" in the name of Gregory J. Beaumont and Lloyd Matthews.

BACKGROUND OF THE INVENTION

This invention relates in general to vertical sweep signal processing for a CRT in a video display and in particular to circuitry for generating a sawtooth current waveform in the deflection coils of a CRT for controlling scan and retrace of an electron beam in a video display.

Since the present invention finds particular utility in the vertical deflection circuit of a CRT in a video display, it will be particularly described with reference to its use in such apparatus, although it will be appreciated that its uses are by no means limited to such applications.

Deflection circuits utilized in television receivers, and in CRT video displays in general, synchronize the deflection signals used to control the sweep of the electron beam with synchronizing pulses recovered from the composite video signals received by the television receiver or video display. These circuits typically make use of the charge-discharge cycle of a capacitor in generating a sawtooth current waveform having a predetermined period and magnitude. The ramp of the sawtooth current waveform is generally developed from the discharge of a capacitor while the capacitor is recharged during the retrace period. It is by means of this sawtooth current waveform imposed upon the CRT's deflection coils that the electron beam scans and retraces over the faceplate of the CRT at the appropriate times.

Various approaches to deflection circuit design and, in particular, synchronization oscillator design to achieve synchronization of electron beam sweep with input synchronization pulses are disclosed in the prior art. Early attempts in this area utilized switching diodes in combination with a voltage source to alternately charge and discharge the capacitor. These efforts were followed by the incorporation of transistors in CRT sawtooth current waveform generation circuits. These components made the electron beam deflection circuits more reliable, more economical and, in general, better performing in terms of switching speeds and power consumption. These transistorized sawtooth deflection generators, however, suffered from characteristic operating limitations imposed on the current and the voltage of transistor deflection circuits. These performance limitations gave rise to the development of silicon controlled rectifier (SCR) circuits formed of a semi-conductor assembly capable of operating at higher currents than that of normal rectifier which has been modified to "block" in the forward direction until a small signal is applied to the control electrode, or gate. After the control signal is applied, the device conducts in the forward direction with a forward characteristic very similar to that of a normal silicon rectifier and continues to conduct even after the control signal has been removed. In this manner, a multivibrator combination may be made for providing a stable oscillator for synchronizing sweep signals with synchronization input signals. The SCR-type oscillator-deflection circuits were not without limitations, however. Among their performance limitations were instabilities, or drift, in the signal voltage levels required to initiate the transistion to a stable oscillating state. Another inherent operating limitation in SCR oscillators is the requirement for an outside source of high power signals to terminate the SCR's oscillatory state.

One approach to the design of an SCR sawtooth wave generator is disclosed in U.S. Pat. No. 4,122,363. Disclosed therein is a circuit arrangement for obtaining a periodic sawtooth current in a coil utilizing a controllable switching device, or SCR, whose control electrode is connected to a source of periodic drive pulses which render the switching device conductive during part of the sawtooth period. While taking advantage of the reliability and ease of firing of thyristors, this invention requires a synchronization drive input pulse of a uniform width during each deflection cycle in order to initiate retrace. A lack of uniformity in synchronization input drive pulse width from one cycle to another can result in improper operation of the deflection circuit.

A transistorized vertical sawtooth deflection generator is disclosed in U.S. Pat. No. 3,435,282. This system provides a transistorized, self-oscillating vertical deflection generator utilizing a single capacitor of small value. Two coupled transistors form a self-oscillating network for charging a capacitor in a manner such that charge is being replaced on the negative terminal of the capacitor during discharge which has the effect of prolonging its discharge time and linearizing its rate of discharge. By also connecting the capacitor to a source of rising voltage during the trace interval the discharge of the capacitor is thereby impeded thus making it possible to use a capacitor of relatively small value while still achieving a slow rate of discharge. This system, however, was not designed to synchronize a DC-coupled vertical drive circuit with synchronization drive input signals of varying voltage amplitude and pulse width.

Still another approach to the design of a sawtooth current waveform generator for a CRT deflection system is disclosed in U.S. Pat. No. 4,110,666. This circuit makes use of two SCR's in combination one of which is turned on by the input synchronization pulses with the other turned on by pulses applied just before the end of line scan. The first SCR provides for electron beam scan synchronization while the second SCR provides for proper retrace of the electron beam. This arrangement suffers from the aforementioned trigger pulse turn-on instabilities and drift while being limited in the synchronization input signal pulse width with which it can operate.

The present invention, however, overcomes these limitations by providing a self-oscillating transistorized circuit possessing a predictable triggering level and capable of generating a sawtooth waveform of a given period and current, or voltage, level from input synchronization signals of variable pulse width and voltage level.

OBJECTS OF THE INVENTION

Accordingly, it is an object of the present invention to provide an improved system for synchronizing the vertical sweep of an electron beam in the CRT of a video display with synchronization drive input signals provided to the video display.

Another object of the present invention is to provide an improved vertical oscillator for driving DC-coupled, vertical drive circuitry with a great variety of vertical drive synchronization input signals.

Still another object of the invention is to provide an improved free-running oscillator for generating a precisely controlled sawtooth current waveform for driving vertical sweep circuitry of a CRT in a video display.

BRIEF DESCRIPTION OF THE DRAWINGS

The appended claims set forth those novel features believed characteristic of the invention. However, the invention itself, as well as further objects and advantages thereof, will best be understood by reference to the following detailed description of a preferred embodiment taken in conjunction with the accompanying drawings in which:

FIGS. 2A thru 2D show a set of waveforms indicating the current and voltage at several points in the self-oscillating sawtooth current deflection generator.

DESCRIPTION OF THE PREFERRED EMBODIMENT

Figure 1:
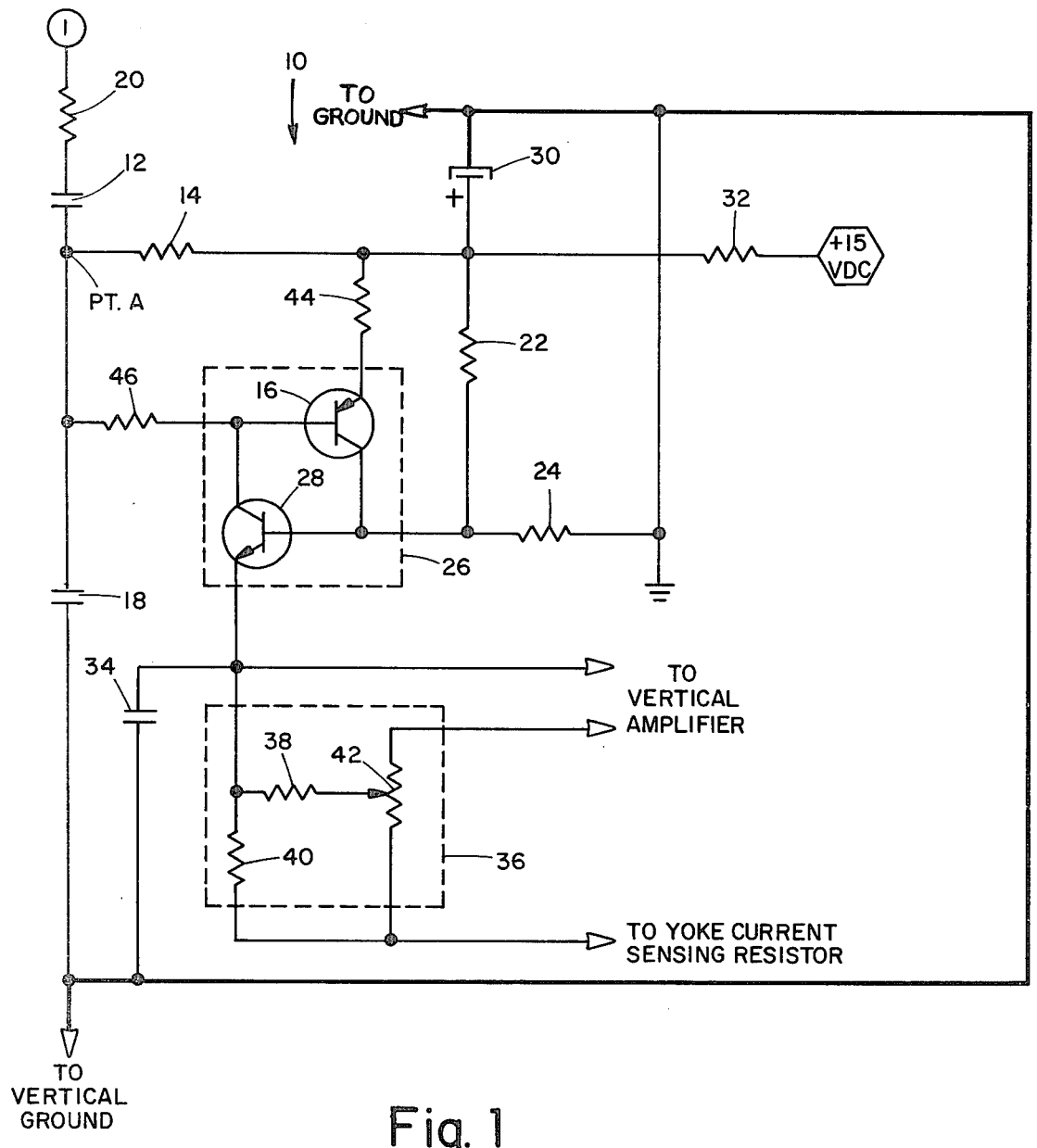
FIG. 1 is a circuit diagram illustrating the basic construction of a self-oscillating sawtooth current deflection generator for a CRT deflection system embodying the principles of the present invention.

Referring to the circuit diagram of FIG. 1, there is shown a self-oscillating sawtooth deflection generator 10 in accordance with the preferred embodiment of the present invention. Vertical drive negative synchronization input pulses enter the system via pin no. 1 of the edge connector. The sawtooth waveform generator 10 is powered by a +15 volt DC supply. As shown in the figure, in the preferred embodiment of the present invention the output of the sawtooth current generator 10 is provided to later stages of the vertical drive circuit (not shown), such as the vertical amplifier and the vertical driver (also not shown). The later stages of the vertical drive circuit with which the present invention interfaces are described in patent application Ser. No. 077,432, filed Sept. 20, 1979, entitled "VERTICAL DRIVE CIRCUIT FOR VIDEO DISPLAY" in the names of Gregory J. Beaumont and Lloyd Matthews, which is assigned to the assignee of the present application. It is the output of the vertical drive circuit which controls the vertical deflection yoke.

A pulse waveform of TTL-level logic input on pin no. 1 is used to trigger the sawtooth current deflection generator 10. A differentiation network comprised of capacitor 12 and resistor 14 isolates the leading edge of the input pulses by emitting a pulse corresponding to the leading edge of an input pulse which is used to trigger the sawtooth current generator 10. This differentiation network generates a positive pulse for a positive-going input pulse edge and a negative pulse when a negative-going edge of an input pulse is received. The sawtooth current generator, however, is triggered only be a negative-going pulse because the input is provided to the base of transistor 16 which results in the turn-on of this transistor. The input pulses can vary in width and amplitude because of the fact that the sawtooth generator 10 is responsive to the leading edge of an input pulse. Thus, in the preferred embodiment of the present invention the vertical drive synchronization input pulses may vary from 2.5 to 5.5 volts and 50 microseconds to 1.4 milliseconds in pulse width. These performance parameters are merely representative numbers which may be varied by changing component values in the present invention.

Capacitor 18 filters out high frequency, extremely narrow pulses which could erroneously trigger the sawtooth current generator 10. Resistor 20 performs a signal limiting function so that input signals of the proper amplitude range are provided to the sawtooth current generator. The frequency range of input signals with which the preferred embodiment of the present invention may operate is 47 to 63 $H_z$. Again, these numbers are merely representative values of performance parameters which may be modified by changing component values or by minor modifications in circuit design.

In accordance with the present invention, resistors 22 and 24 in combination with the +15 volt DC supply establish a voltage level on the oscillator network 26 formed by transistor 16 and transistor 28 at which the oscillator will trigger. This oscillator network 26 will free run until it receives a synchronization drive input signal of sufficient voltage level on the base of transistor 16. The synchronization drive input pulse is not seen on the emitter of transistor 16 because of the RC-filtering network consisting of capacitor 30 and resistor 22 across which the B+ supply of +15 volts DC is applied. Thus transistor 16 acts as a PNP-type transistor with a DC power supply coupled to its emitter so that transistor turn-on is initiated when the base voltage drops below the emitter voltage. Transistor 16 is turned on, or conducts, when a negative input pulse of at least 0.6 volts is applied to its base. When transistor 16 turns on emitter and collector current start to flow therein which, in turn, feeds the base of transistor 28. Positive current pulses generated at the collector of transistor 16 and transmitted to the base of transistor 28 cause transistor 28, which is an NPN-type transistor, to begin conducting current. This signal input to the base of transistor 28 results in current being pulled from the collector of transistor 28 resulting in more base current from transistor 16 which turns this transistor on harder. With transistor 16 turned on harder, transistor 28 is also turned on harder and the oscillator network, or multivibrator, 26 acts as a regenerative circuit in the sense that transistors 16 and 28 turn each other on and reinforce each other once turned on. Similarly, when one transistor stops conducting, the other transistor of the oscillator network also turns off. The transistorized oscillator network 26 thus acts as an SCR analogue circuit in which a first input pulse initiates oscillation and a second input pulse terminates oscillation.

A voltage divider network comprised of resistors 22, 24 and 32 establishes two voltage levels on the oscillator network 26. A high voltage level is established at the junction of resistors 22 and 32 while a low voltage level is established at the junction of resistors 22 and 24. The oscillator network 26 charges up to the voltage level established by resistors 22, 24 and 32 with the high voltage level establishing the upper voltage across the oscillator network and the lower voltage level establishing the lower voltage across the oscillator network during operation.

With the lower voltage level of the oscillator network 26 established by the voltage at the junction of resistors 22 and 24, when an input pulse is delivered to the base of transistor 28 initiating current flow an increasing voltage level is established across the oscillator network 26. Because of the self-regenerative characteristic of the oscillator network's transistor configuration, current flow increases in the oscillator network 26 until the voltage across the oscillator network reaches the high voltage level established at the junction of resistors 22 and 32. During this period of increasing current flow and voltage buildup capacitor 34 is charged by the emitter current of transistor 28. When the oscillator network 26 charges up to the high voltage level established at the junction of resistors 22 and 32 current ceases flowing through the circuit with charge no longer being delivered to capacitor 34. The collector of transistor 28 thereupon stops conducting with capacitor 34 fully charged causing the base current of transistor 16 to cease. The oscillator network 26 has then turned off, ceasing to conduct and resets itself for the next negative input pulse on the base of transistor 16.

After capacitor 34 charges up and transistors 16 and 28 stop conducting, the vertical size control network 36 begins to discharge capacitor 34 negatively. The charging of capacitor 34 by means of the oscillator network 26 followed by the negative discharge of capacitor 34 by means of the vertical size control network 36 results in a sawtooth waveform being generated by the system. With capacitor 34 fully charged and transistors 16 and 28 turned off, current cannot pass through the oscillator network 26. Thus, capacitor 34 discharges through the vertical size control network 36 which is comprised of discharge resistors 38 and 40 and vertical size potentiometer 42. The vertical size control network 36 thus serves not only as a discharge path for capacitor 34, but in so doing, also, in conjunction with the synch pulse, establishes the lower voltage limit of the sawtooth output waveform. Discharging resistors 38, 40 and 42 are thus instrumental in shaping the discharging voltage waveform of capacitor 34.

As capacitor 34 charges up transistor 16 goes into saturation. Because there is only a very slight voltage drop across the 47 ohms of resistor 44, the saturation voltage is applied across the emitter-collector combination of transistor 16. Voltage builds up across the base of transistor 16 at the same rate as capacitor 34 is charged. The base of transistor 16 follows the emitter voltage upward, but displaced 0.6 volts below it, and when capacitor 34 discharges, it comes down suddenly to the DC voltage level established by the voltage divider network of resistors 22 and 24. The voltage drop across transistor 16 is 0.2 volts while the voltage drop across transistor 28 is 0.6 volts.

Initially capacitor 34 is at ground when the system is turned on. Capacitor 34 begins to charge up when transistor 16 and transistor 28 are turned on and continues to charge until the base voltage and the emitter voltage of transistor 28 get to within 0.6 volts of each other. Thereupon, transistor 28 is turned off so that the voltage to which capacitor 34 is charged is equal to the voltage at the junction of resistor 22 and resistor 32 minus the saturation voltage of transistor 16, the base-emitter junction voltage of transistor 28 and the voltage drop across the 47 ohms of resistor 44 (which is essentially negligable).

The operation and performance of the sawtooth current generator 10 can be better understood by reference to FIGS. 2A thru 2D. FIG. 2A shows the vertical drive negative synchronization pulses input on pin no. 1. FIG. 2B shows the pulses corresponding to the negative-going and positive-going edges of the vertical drive negative synchronization pulses present at point A in the circuit. These positive and negative pulses are generated by the differentiation network comprised of capacitor 12 and resistor 14. It is the negative pulses which are seen by the base of transistor 16. FIG. 2C shows the positive input pulses to the base of transistor 28 from the collector of transistor 16. Finally, FIG. 2D shows the voltage on the emitter of transistor 28 and the corresponding buildup of charge and subsequent discharge of capacitor 34. The high voltage level of the curve shown in FIG. 2D is determined by the voltage divider network comprised of resistors 22, 24 and 32, while the low voltage level is determined by the vertical size control network 36, which is comprised of resistors 38, 40 and 42, and the time interval between synch pulses.

By way of illustrative example and not by way of limitation, the following components of the preferred embodiment of the present invention may have the following values:

| Reference No. | Preferred Value |
|---|---|
| 12 | 0.01 microfarads |
| 14 | 22 kilohms |
| 18 | 0.0033 microfarads |
| 20 | 6.8 kilohms |
| 22 | 9.1 kilohms |
| 24 | 22 kilohms |
| 30 | 22 microfarads |
| 32 | 39 kilohms |
| 34 | 0.15 microfarads |
| 38 | 820 kilohms |
| 40 | 1.5 megohms |
| 42 | 250 kilohms (variable) |
| 44 | 47 ohms |
| 46 | 200 kilohms |

There has thus been provided a self-oscillating sawtooth current deflection generator for synching the vertical sweep of a CRT in a video display with vertical drive synchronization input signals. By coupling two transistors in a current-regenerative configuration, a stable, inexpensive, free-running oscillator is formed which is triggered by precisely defined voltage levels for charging a capacitor, the output of which is a sawtooth waveform.

In addition, while particular embodiments of the invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention.

I claim:

1. A self-oscillating deflection generator for producing a sawtooth current waveform in a magnetic deflection coil of a cathode ray tube comprising:
   pulse differentiation means coupled to a source of input pulses for generating a series of output pulses, each of said output pulses representing the leading edge of each of said input pulses;
   first transistor means coupled to said pulse differentiation means for receiving said output pulses;
   a DC voltage source coupled to said first transistor means so as to maintain said first transistor means at a first voltage level with said first transistor means rendered conductive upon receipt of said output pulses;

second transistor means coupled to said DC voltage source and to said first transistor means such that the current output of said first transistor means is connected to the input of said second transistor means with the current output of said second transistor means connected to the input of said first transistor means so as to form a regenerative, oscillatory network;

voltage divider means coupling said second transistor means with said DC voltage source so as to maintain said second transistor means at a second voltage level, said second voltage level being less than said first voltage level;

capacitor means coupled to said second transistor means such that said capacitor means is charged by the output of said second transistor means; and discharge means coupled to said capacitor means for discharging said capacitor means when said capacitor means becomes fully charged and said first and second transistor means stop conducting thereby generating a sawtooth current waveform.

2. A deflection generator according to claim 1, wherein said voltage divider network establishes a selected second voltage level on said second transistor means thereby producing a desired peak-to-peak voltage output by said discharging capacitor means.

3. A deflection generator according to claim 1, wherein said first transistor means is a PNP-type with the base of said first transistor means being coupled to the output pulses and the collector of said first transistor means being coupled to the base of said second transistor means, and said second transistor means is an NPN-type with the collector of said second transistor means being coupled to the base of said first transistor means and the emitter of said second transistor means being coupled to said capacitor means.

4. A deflection generator according to claim 1, wherein said source of input pulses provides negative pulses to said self-oscillating deflection generator with said pulse differentiation means being responsive to said negative-going leading edge of said input pulses in generating said output pulses.

5. A self-oscillating deflection generator for producing a sawtooth current waveform in a magnetic deflection coil of a cathode ray tube comprising:

pulse differentiation means coupled to a source of input pulses for generating a series of output pulses, each of said output pulses representing the leading edge of each of said input pulses;

a first PNP-type transistor means having a base coupled to said pulse differentiation means for receiving said output pulses;

a DC voltage source coupled to the emitter of said first transistor means so as to maintain said first transistor means at a first voltage level with said first transistor means rendered conductive upon receipt of said output pulses;

a second NPN-type transistor means having a base coupled to said DC voltage source and to the collector of said first transistor means and a collector coupled to the base of said first transistor means such that the current output of said first transistor means is connected to the input of said second transistor means with the current output of said second transistor means connected to the input of said first transistor means so as to form a regenerative, oscillatory network;

voltage divider means coupling the base of said second transistor means with a DC voltage source so as to maintain said second transistor means at a second voltage level, said second voltage level being less than said first voltage level;

capacitor means coupled to the emitter of said second transistor means such that said capacitor means is charged by the output of said second transistor means; and discharge means coupled to said capacitor means for discharging said capacitor means when said capacitor means becomes fully charged and said first and second transistor means stop conducting thereby generating a sawtooth current waveform.

* * * * *